United States Patent
Takahashi

(10) Patent No.: US 12,200,954 B2
(45) Date of Patent: Jan. 14, 2025

(54) DISPLAY DEVICE

(71) Applicant: Japan Display Inc., Tokyo (JP)

(72) Inventor: Hideyuki Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 385 days.

(21) Appl. No.: 17/585,759

(22) Filed: Jan. 27, 2022

(65) Prior Publication Data

US 2022/0238835 A1 Jul. 28, 2022

(30) Foreign Application Priority Data

Jan. 28, 2021 (JP) ................. 2021-012185

(51) Int. Cl.
*H10K 50/813* (2023.01)
*H10K 50/824* (2023.01)
*H10K 59/12* (2023.01)
*H10K 59/122* (2023.01)
*H10K 59/80* (2023.01)
*H10K 71/00* (2023.01)

(52) U.S. Cl.
CPC ......... *H10K 50/813* (2023.02); *H10K 50/824* (2023.02); *H10K 59/122* (2023.02); *H10K 59/80515* (2023.02); *H10K 59/80522* (2023.02); *H10K 71/00* (2023.02); *H10K 59/1201* (2023.02)

(58) Field of Classification Search
CPC .............. H10K 50/818; H10K 50/822; H10K 59/80522; H10K 50/824; H10K 50/813; H10K 59/80515; H10K 59/122
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2014/0231789 A1 | 8/2014 | Miura et al. | |
| 2015/0048328 A1* | 2/2015 | Kato | H10K 59/80515 |
| | | | 438/34 |
| 2017/0271421 A1 | 9/2017 | Jinbo et al. | |
| 2022/0102669 A1* | 3/2022 | Liu | H10K 71/00 |
| 2024/0023371 A1* | 1/2024 | Yamazaki | H10K 50/19 |

FOREIGN PATENT DOCUMENTS

| | | | | |
|---|---|---|---|---|
| CN | 109509765 B | * 12/2021 | ......... | H01L 27/3246 |
| JP | 2000-195677 A | 7/2000 | | |
| JP | 2004-207217 A | 7/2004 | | |

(Continued)

OTHER PUBLICATIONS

Office Action issued on Aug. 20, 2024, in corresponding Japanese Application No. 2021-012185, 6 pages.

*Primary Examiner* — Alia Sabur
(74) *Attorney, Agent, or Firm* — Maier & Maier, PLLC

(57) ABSTRACT

According to one embodiment, a display device includes a base material, a first insulating layer disposed on the substrate, a first electrode disposed on the first insulating layer, an organic layer disposed on the first electrode, a second electrode disposed on the organic layer, a second insulating layer disposed on the first insulating layer and including an opening portion overlapping with the second electrode, and a third electrode covering the second electrode and the second insulating layer. The first electrode, the organic layer, and the second electrode are separated for each pixel.

3 Claims, 11 Drawing Sheets

(56) References Cited

FOREIGN PATENT DOCUMENTS

| JP | 2008-135325 | A | 6/2008 |
| JP | 2009-032673 | A | 2/2009 |
| JP | 2010-118191 | A | 5/2010 |
| JP | 201389505 | A | 5/2013 |
| JP | 2017174811 | A | 9/2017 |
| WO | 2022123383 | A1 | 6/2022 |

* cited by examiner

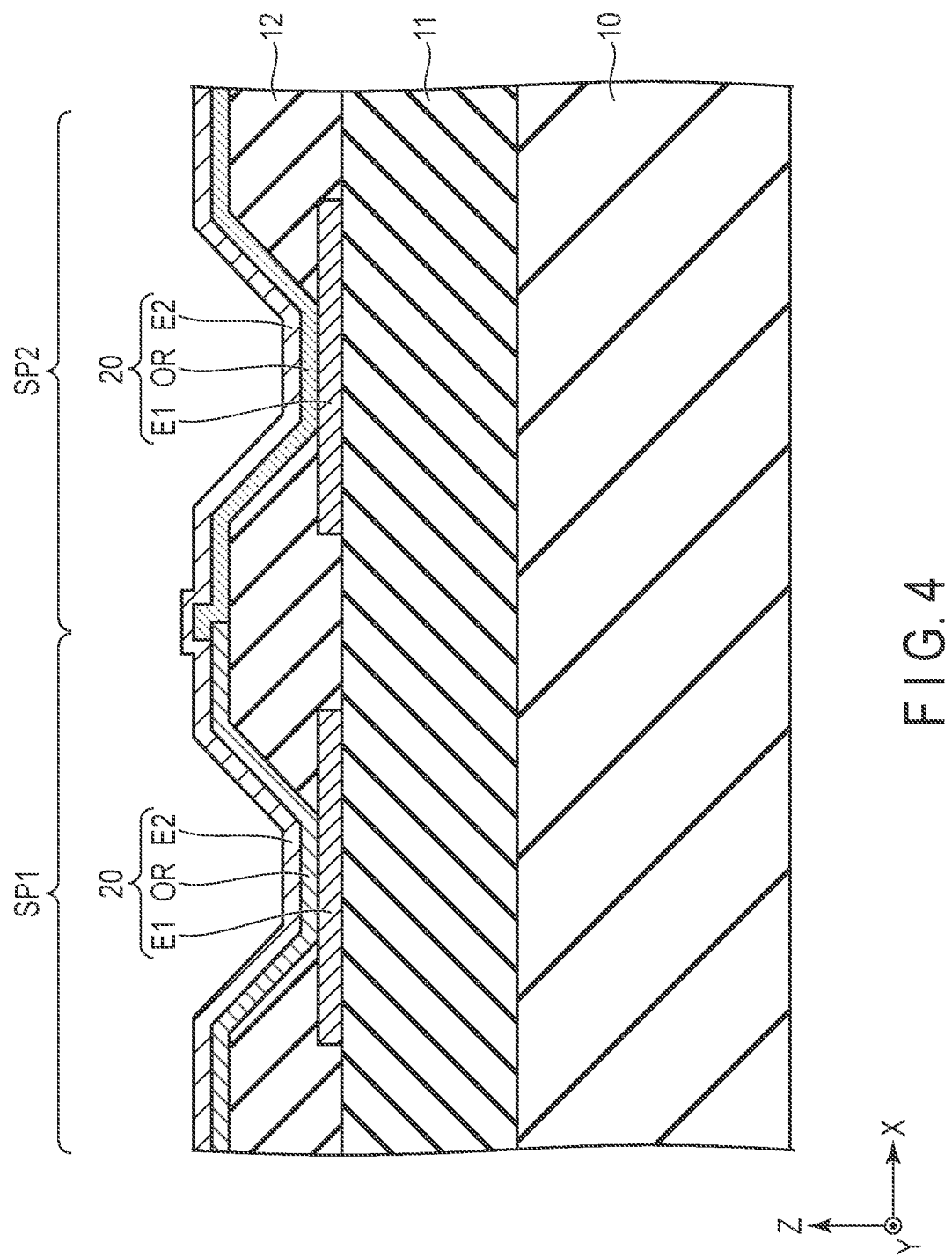
F I G. 4

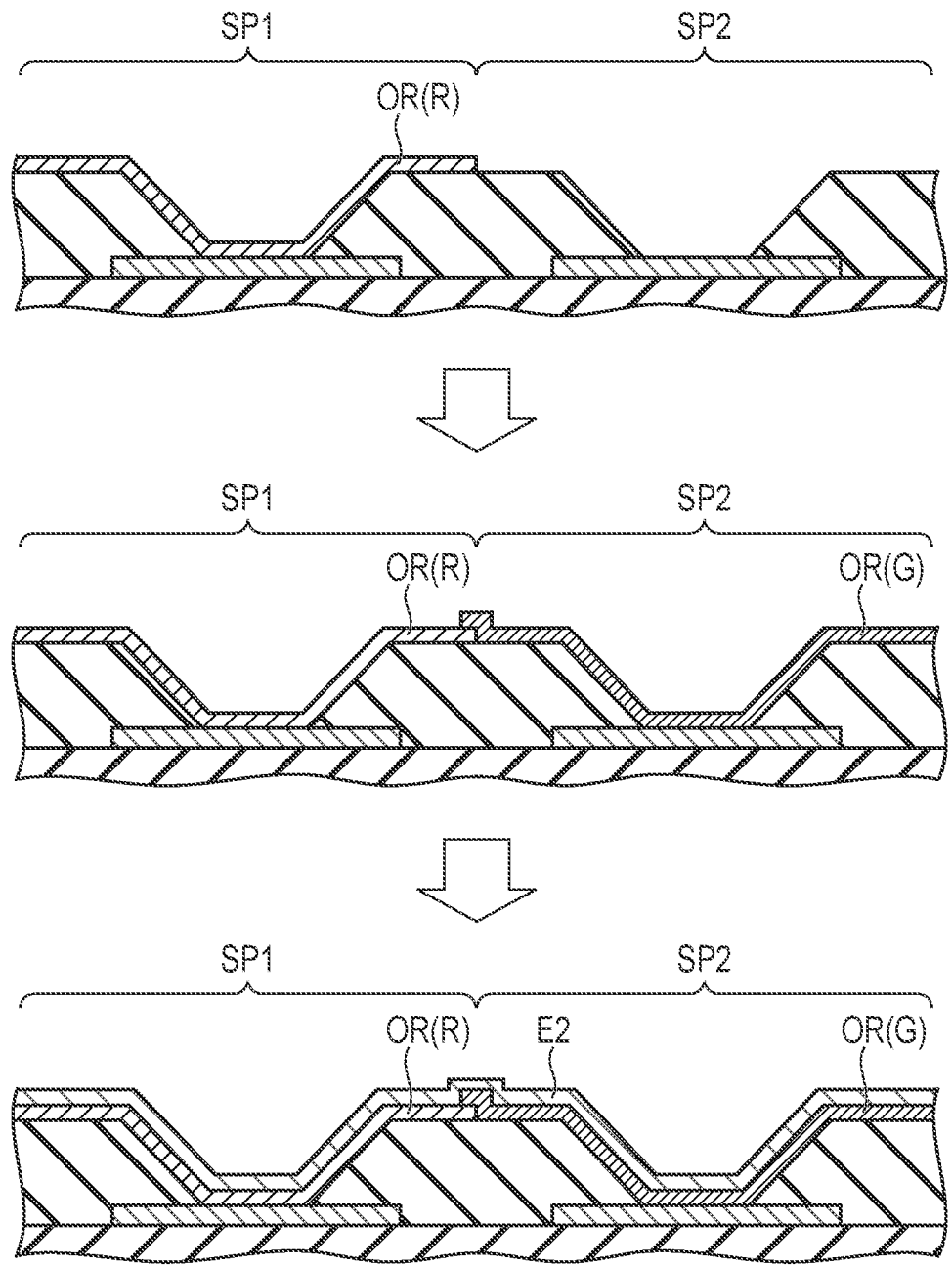
F I G. 5

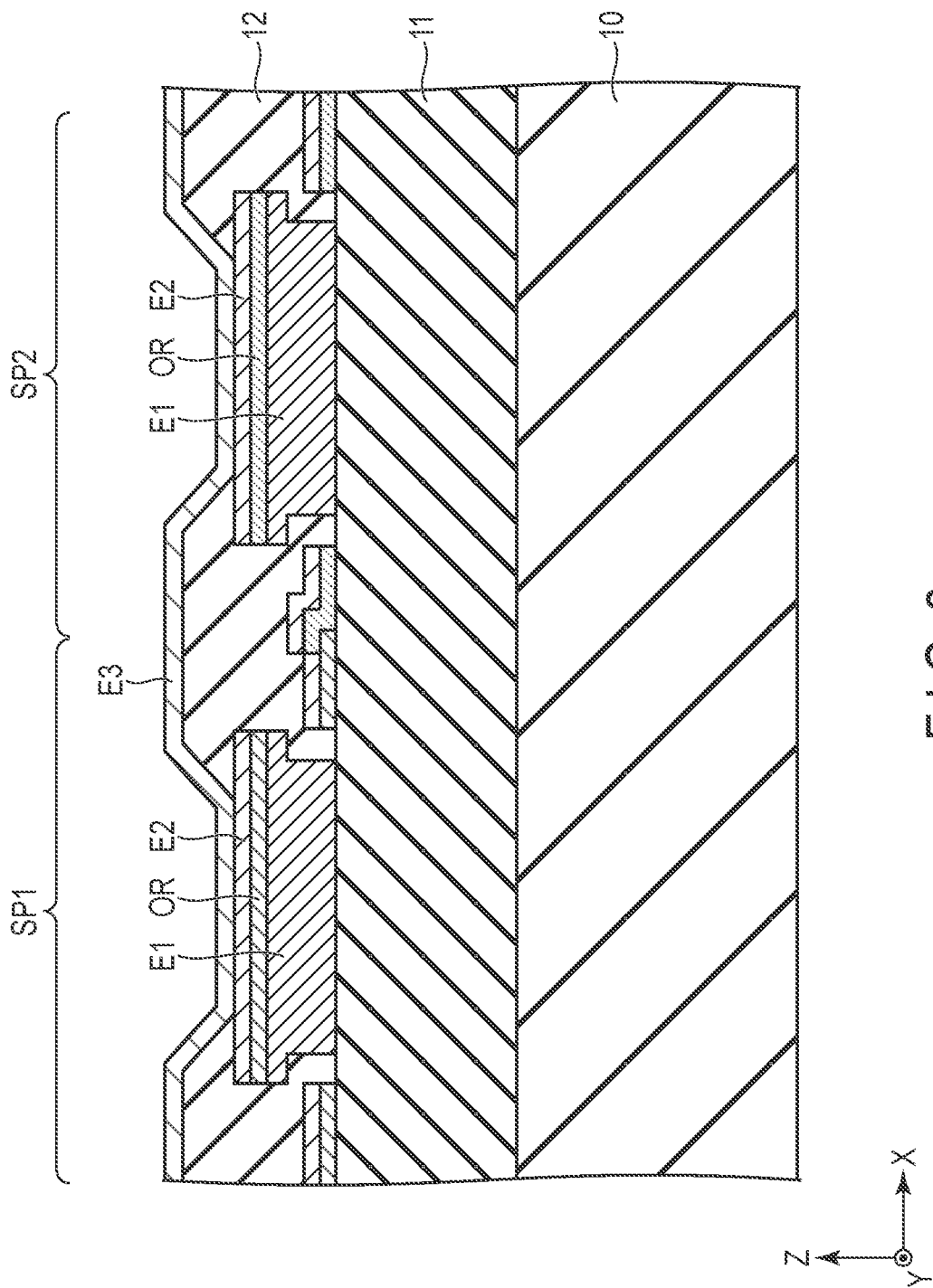
F I G. 6

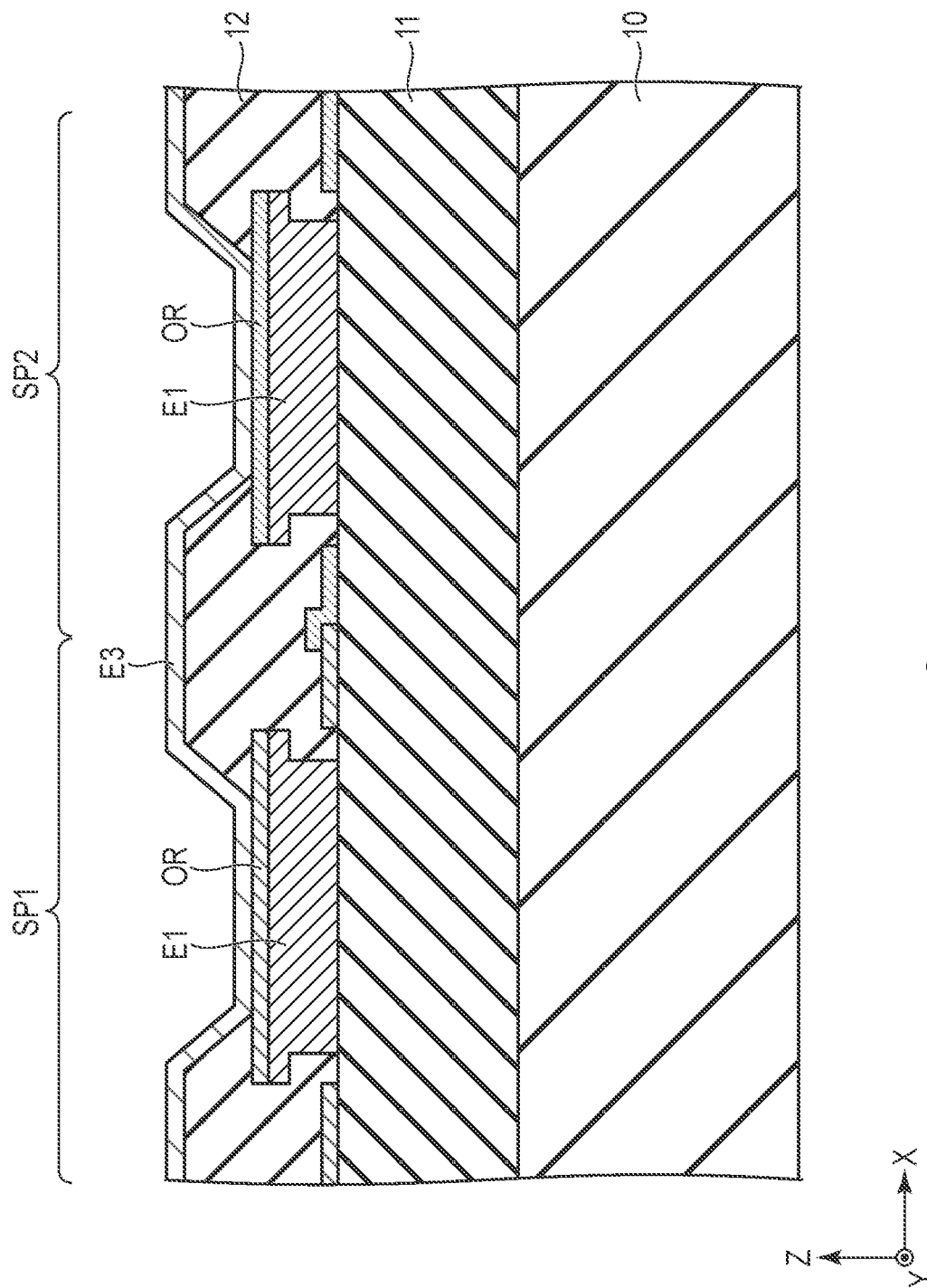
F I G. 11

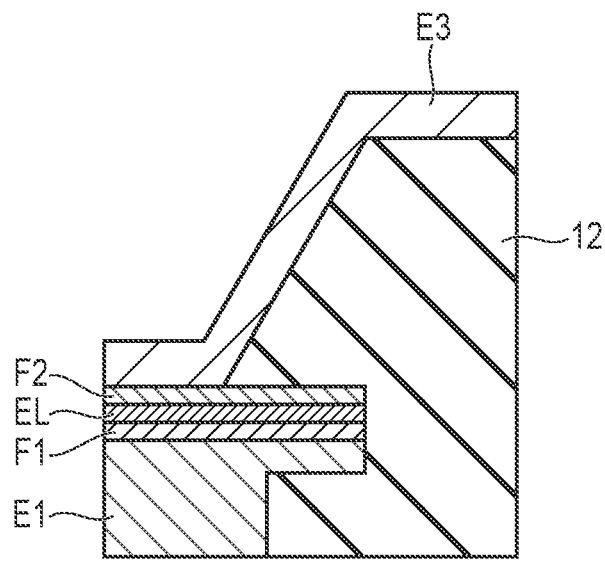
F I G. 13

DISPLAY DEVICE

CROSS-REFERENCE TO RELATED APPLICATIONS

This application is based upon and claims the benefit of priority from Japanese Patent Application No. 2021-012185, filed Jan. 28, 2021, the entire contents of which are incorporated herein by reference.

FIELD

Embodiments described herein relate generally to a display device.

BACKGROUND

In recent years, a display device to which an organic light-emitting diode (OLED) is applied as a display element has been put into practical use. The display element includes an organic layer between a pixel electrode and a common electrode.

However, depending on the configuration of the display device, an unintended current (lateral leakage) may be generated from the edge portion of the organic layer, and the lateral leakage may cause deterioration in the display quality of the display device.

BRIEF DESCRIPTION OF THE DRAWINGS

FIG. 4 shows an example of a cross section of a display area included in a display device according to a comparative example of the present embodiment.

FIG. 5 is a drawing for explaining a process by which an organic layer and a second electrode are formed in the display device according to the comparative example of the present embodiment.

FIG. 6 shows an example of a cross section of a display area included in the display device according to the present embodiment.

FIG. 11 shows an example of a cross section of a display area included in a display device according to a second embodiment.

FIG. 13 is an enlarged view of an edge portion of the organic layer in the display device according to the present embodiment.

DETAILED DESCRIPTION

Figure 1:
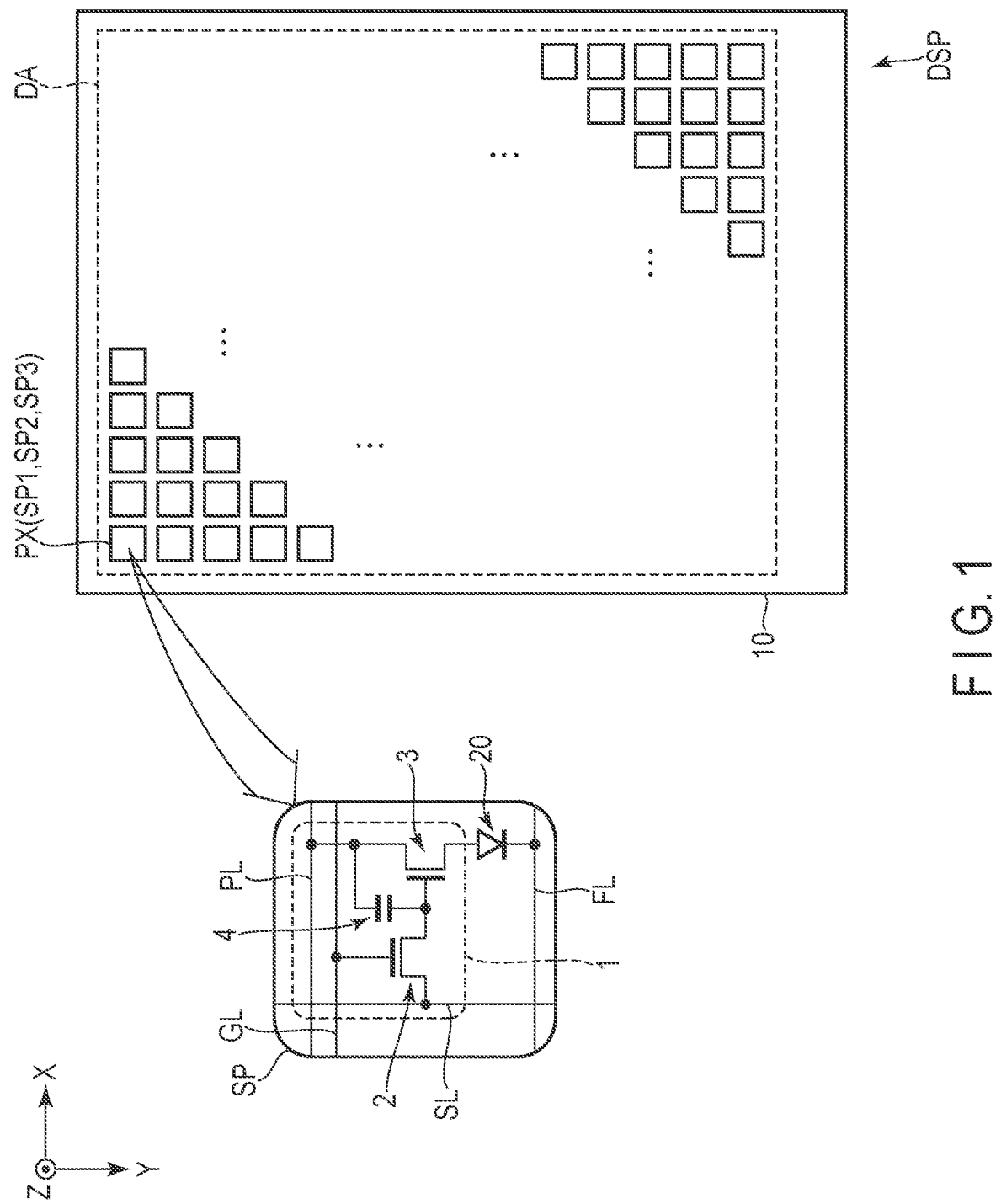
FIG. 1 shows an example of a configuration of a display device according to a first embodiment.

In general, according to one embodiment, a display device includes a base material, a first insulating layer disposed on the substrate, a first electrode disposed on the first insulating layer, an organic layer disposed on the first electrode, a second electrode disposed on the organic layer, a second insulating layer disposed on the first insulating layer and including an opening portion overlapping with the second electrode, and a third electrode covering the second electrode and the second insulating layer. The first electrode, the organic layer, and the second electrode are separated for each pixel.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. In this embodiment, viewing towards an X-Y plane defined by the X axis and the Y axis is referred to as planar view. Further, the third direction Z is referred to as "upward" and a direction opposite to the third direction is referred to as "downward". With such expressions "a second member above a first member" and "a second member below a first member", the second member may be in contact with the first member or may be remote from the first member.

A display device DSP according to the present embodiment is an organic electroluminescent display device including an organic light-emitting diode (OLED) as a display element, and is mounted on a television, a personal computer, a mobile terminal, and a cell phone, etc.

First Embodiment

First, a first embodiment will be explained. FIG. 1 shows an example of a configuration of a display device DSP in the present embodiment. The display device DSP includes a display area DA for displaying an image on an insulating base material 10. The base material 10 may be glass or a flexible resin film.

The display area DA includes a plurality of pixels PX arranged in a matrix in a first direction X and a second direction Y. A pixel PX includes, for example, a plurality of sub-pixels SP. In one example, the pixel PX includes a sub-pixel SP1 for displaying red, a sub-pixel SP2 for displaying green, and a sub-pixel SP3 for displaying blue. Note that the pixel PX may include four or more sub-pixels SP including sub-pixels for displaying other colors such as white in addition to the above three sub-pixels.

Here, a configuration example of one sub-pixel SP provided in the pixel PX will be briefly explained. The sub-pixel SP includes a pixel circuit 1 and a display element 20. The pixel circuit 1 includes a pixel switch 2, a drive transistor 3, and a capacitor 4. The pixel switch 2 and the drive transistor 3 are switch elements configured by, for example, a thin film transistor (TFT).

In the pixel switch 2, a gate electrode is connected to a scanning line GL, a source electrode is connected to a signal line SL, and a drain electrode is connected to one of the electrodes configuring the capacitor 4 and a gate electrode of the drive transistor 3. In the drive transistor 3, a source electrode is connected to the other electrode configuring the capacitor 4 and a power line PL, and a drain electrode is connected to an anode electrode of the display element 20. A cathode electrode of the display element 20 is connected to a power supply line FL. Note that the configuration of the pixel circuit 1 is not limited to the illustrated example.

The display element 20 is an organic light-emitting diode (OLED), which is a light-emitting element. In the case where the sub-pixel SP1 displays red as described above, the display element 20 included in the sub-pixel SP1 is configured to emit light corresponding to a red wavelength. In the case where the sub-pixel SP2 displays green, the display element 20 included in the sub-pixel SP2 is configured to emit light corresponding to a green wavelength. In the case where the sub-pixel SP3 displays blue, the display element 20 included in the sub-pixel SP3 is configured to emit light corresponding to a blue wavelength. The configuration of the display element 20 will be described later.

Figure 2:
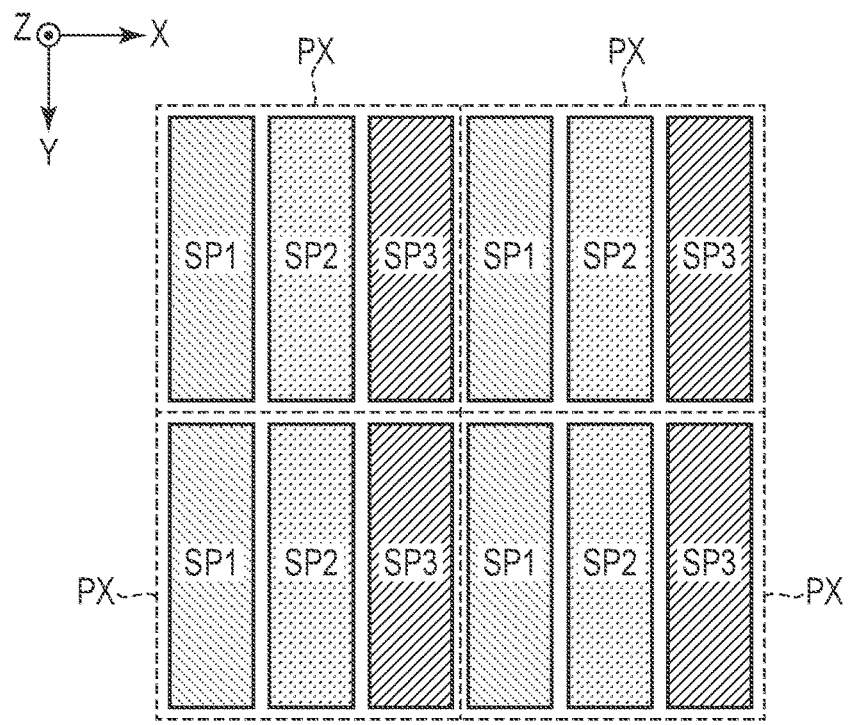
FIG. 2 shows an example of a layout of sub-pixels included in a pixel.

FIG. 2 shows an example of a layout of a plurality of sub-pixels SP (SP1, SP2, and SP3) included in a pixel PX. Here, the explanation will focus on the four pixels PX shown in FIG. 1 with single-dotted lines.

The sub-pixels SP1, SP2, and SP3, which configure one pixel PX, are formed approximately in a rectangular shape extending respectively in the second direction Y, and are arranged side by side in the first direction X. Focusing on two pixels PX arranged side by side in the first direction X, the colors displayed in the adjacent sub-pixels SP are different from each other. Furthermore, focusing on two pixels PX arranged side by side in the second direction Y, the colors displayed in the adjacent sub-pixels SP are the same. Note that the area of each of the sub-pixels SP1, SP2, and SP3 may be the same or different from each other.

Figure 3:
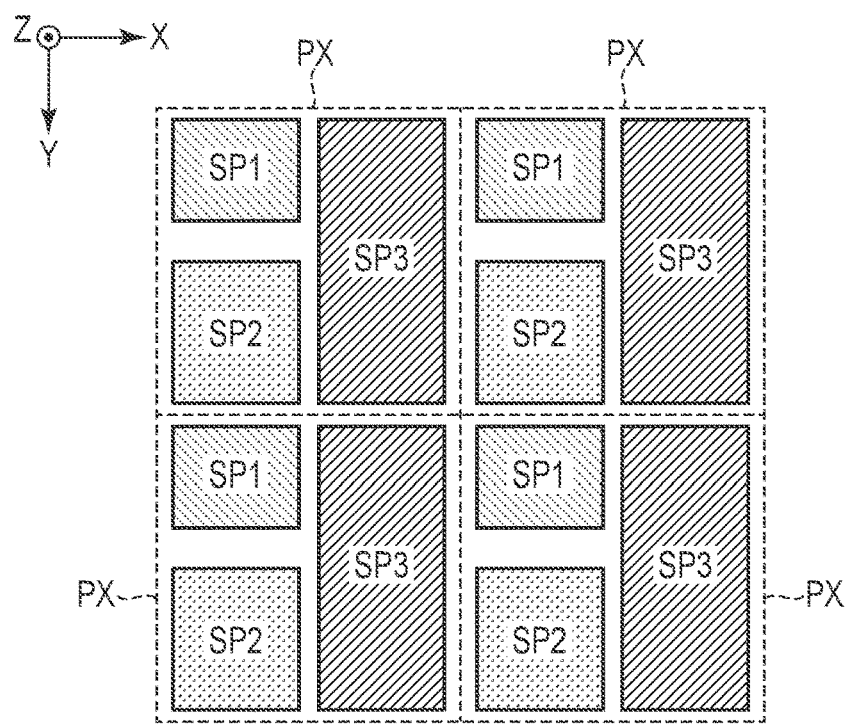
FIG. 3 shows another example of a layout of sub-pixels included in a pixel.

FIG. 3 shows another example of the layout of a plurality of sub-pixels SP (SP1, SP2, and SP3) included in a pixel PX.

Among the sub-pixels configuring a single pixel PX, the sub-pixels SP1 and SP2 are arranged side by side in the second direction Y, the sub-pixels SP1 and SP3 are arranged side by side in the first direction X, and the sub-pixels SP2 and SP3 are arranged side by side in the first direction X. The sub-pixel SP1 is formed approximately in a rectangular shape extending in the first direction X, and the sub-pixels SP2 and SP3 are formed approximately in a rectangular shape extending in the second direction Y. The area of sub-pixel SP2 is larger than the area of sub-pixel SP1, and the area of sub-pixel SP3 is larger than the area of sub-pixel SP2. The area of sub-pixel SP1 may be the same as the area of sub-pixel SP2.

Focusing on the two pixels PX arranged side by side in the first direction X, in the area where the sub-pixels SP1 and SP3 are arranged alternately, and in the area where the sub-pixels SP2 and SP3 are arranged alternately, the colors displayed in the sub-pixels SP adjacent in the first direction X are different from each other. On the other hand, focusing on the two pixels PX arranged side by side in the second direction Y, in the area where the sub-pixels SP1 and SP2 are alternately arranged, the colors emitted by the sub-pixels SP adjacent in the second direction Y will be the same as each other. In the area where a plurality of sub-pixels SP3 are arranged side by side, the colors displayed in the sub-pixels SP adjacent in the second direction Y are the same.

The outline of the sub-pixels SP (SP1, SP2, and SP3) shown in FIG. 2 and FIG. 3 corresponds to the outline of areas in which colors are displayed in the sub-pixels SP (i.e., a light-emitting area); however, the outline is in a simplified form, and does not necessarily reflect the actual shape.

Here, a display device DSP' according to a comparative example of the present embodiment with be explained with reference to FIG. 4. It is assumed that the display device DSP' has the same configuration as the display device DSP shown in FIG. 1, and configurations in common with the display device DSP are described with the same reference symbols as those in FIG. 1.

FIG. 4 shows an example of a cross section of the display area DA included in the display device DSP'. Here, the sub-pixel SP1 and the sub-pixel SP2 adjacent to the sub-pixel SP1, which are provided in the pixel PX disposed in the display area DA, are mainly explained.

An insulating layer 11 is disposed on a base material 10. The pixel circuit 1 shown in FIG. 1 is disposed on the base material 10 and covered by the insulating layer 11; however, this is omitted in FIG. 4. The insulating layer 11 corresponds to the base layer of the display element 20 and is, for example, an organic insulating layer.

The insulating layer 12 is disposed on top of the insulating layer 11. The insulating layer 12 is, for example, an organic insulating layer. An insulating layer 12 is formed to partition the display elements 20 (i.e., sub-pixels SP) included in each of the plurality of sub-pixels SP, and may be referred to as a rib or the like, for example.

The display element 20 includes a first electrode E1, an organic layer OR, and a second electrode E2. The first electrode E1 is an electrode arranged for each display element 20 (i.e., sub-pixel SP) included in each of the plurality of sub-pixels SP, and may be referred to as a pixel electrode, bottom electrode, or anode electrode, etc. The second electrode E2 is an electrode commonly arranged for a plurality of display elements (i.e., a plurality of sub-pixels SP or pixels PX), and may be referred to as a common electrode, a counter electrode, an upper electrode, or a cathode electrode, etc.

The first electrode E1 is disposed on the insulating layer 11, and its periphery is covered by the insulating layer 12. The first electrode E1 is electrically connected to the drive transistor 3. The first electrode E1 is a transparent electrode formed by a transparent conductive material such as indium tin oxide (ITO) or indium zinc oxide (IZO). Note that the first electrode E1 may also be a metal electrode formed by a metallic material such as silver or aluminum. Also, the first electrode E1 may be a stacked layer body of a transparent electrode and a metal electrode. Furthermore, the first electrode E1 may be configured as a stacked layer body in which a transparent electrode, a metal electrode, and a transparent electrode are stacked in that order, or may be configured as a stacked layer body including three or more layers.

Here, the insulating layer 12 has an opening portion OP that overlaps with the first electrode E1 in each sub-pixel SP. In this case, the organic layer OR is disposed on the insulating layer 12 and is in contact with the first electrode E1 through the opening portion OP.

The second electrode E2 is disposed on the organic layer OR so as to cover the organic layer OR. The second electrode E2 is a transparent electrode formed by a transparent conductive material such as ITO or IZO, for example. The second electrode E2 is electrically connected to the power supply line FL disposed in the display area DA or outside the display area DA. Note that the second electrode E2 may be covered by a transparent protective film (including at least one of an inorganic insulating film and an organic insulating film).

In FIG. 4, cross sections of the sub-pixels SP1 and SP2 are shown. The sub-pixel SP1 includes a display element 20 (hereinafter referred to as the display element 20 of the sub-pixel SP1) including the first electrode E1, the organic layer OR, and (a part of) the second electrode E2 disposed at a position overlapping with the sub-pixel SP1. Similarly, the sub-pixel SP2 includes a display element 20 (hereinafter referred to as the display element 20 of the sub-pixel SP2) including the first electrode E1, the organic layer OR, and (a part of) the second electrode E2 disposed at a position overlapping with the sub-pixel SP2.

In the case where the sub-pixel SP1 displays red as described above, the organic layer OR provided in the display element 20 of the sub-pixel SP1 has a light-emitting layer that emits red. In the case where the sub-pixel SP2 displays green, the organic layer OR provided in the display element 20 of the sub-pixel SP2 has a light-emitting layer that emits green. The light-emitting layer of the organic layer OR emits light when a potential difference is formed between the first and second electrodes E1 and E2 (i.e., a drive current is supplied).

In FIG. 4, only sub-pixels SP1 and SP2 are shown; however, the display element 20 of the sub-pixel SP3 is also configured in the same manner as the display elements 20 of the sub-pixels SP1 and SP2. That is, in the case where the sub-pixel SP3 displays blue, the organic layer OR provided in the display element 20 of the sub-pixel SP3 has a light-emitting layer that emits blue.

Here, with reference to FIG. 5, a process by which the organic layer OR and the second electrode E2 are formed in the display device DSP' according to the comparative example of the present embodiment will be briefly described. Here, it is assumed that the first electrode E1 and the insulating layer 12 including the opening portion OP are already formed on the insulating layer 11.

In this case, the organic layer OR is formed on the first electrode E1. Furthermore, in the display element 20 of the sub-pixel SP1 (i.e., a position overlapping with the sub-pixel SP1), it is necessary to form an organic layer OR including a light-emitting layer that emits red (hereinafter referred to as an organic layer OR(R)). On the other hand, in the display element 20 of the sub-pixel SP2 (i.e., a position overlapping with the sub-pixel SP2), it is necessary to form an organic layer OR including a light-emitting layer that emits green (hereinafter referred to as an organic layer OR(G)).

For this reason, in the comparative example of the present embodiment, as shown in FIG. 5, after forming the organic layer OR(R) at the position overlapping with the sub-pixel SP1, the organic layer OR(G) is formed at the position overlapping with the sub-pixel SP2, and the second electrode E2 is formed to cover the organic layers OR(R) and OR(G). The organic layer OR(R) disposed at the position overlapping with the sub-pixel SP1 and the organic layer OR(G) disposed at the position overlapping with the sub-pixel SP2 can be formed by patterning using, for example, a fine mask.

However, in the case where the organic layers OR(R) and OR(G) and the second electrode E2 are formed by the process shown in FIG. 5 above, if a misalignment occurs between sub-pixels SP1 and SP2 (i.e., each color), as shown in FIG. 4 and FIG. 5, for example, the edge portion of the organic layer OR(R) may overlap with the edge portion of the organic layer OR(G). In such a configuration, for example, when displaying green in the sub-pixel SP2 (i.e., emitting light from the light-emitting layer of the organic layer OR(G)), in some cases, a current (lateral leakage) may flow from the edge portion of the organic layer OR(G) to the organic layer OR(R), causing the light-emitting layer of the organic layer OR(R) to emit light (hereinafter referred to as parasitic emission). The parasitic emission based on such lateral leakage may cause color mixing, etc., and may be a cause of deteriorating display quality.

Therefore, the present embodiment has a configuration for suppressing the occurrence of the above-mentioned lateral leakage.

An example of the configuration for suppressing the occurrence of lateral leakage in the display device DSP according to the present embodiment is described below with reference to FIG. 6. FIG. 6 shows an example of a cross section of the display area DA provided in the display device DSP. Here, the sub-pixel SP1 and the sub-pixel SP2 adjacent to the sub-pixel SP1, which are provided in the pixel PX located in the display area DA, are mainly explained. In FIG. 6, parts that are the same as those in FIG. 4 are given the same reference symbols as those in FIG. 4 above, and detailed descriptions thereof are omitted. Parts that are different from those in FIG. 4 are mainly described.

In the present embodiment, the first electrode E1 is placed on the insulating layer 11 in the same manner as in the comparative example of the present embodiment described above. However, the first electrode E1 in the present embodiment differs from the first electrode E1 in the comparative example in that the edge portion of the first electrode E1 is not covered by the insulating layer 12 when the organic layer OR is formed. When the first electrode E1 in the present embodiment is assumed to be formed at least thicker than the organic layer OR, and the organic layer OR is, for example, about 10 nm, the first electrode E1 in the present embodiment is formed at about 100 nm.

In the present embodiment, the organic layer OR is disposed on the first electrode E1, and the second electrode E2 is disposed on the organic layer OR.

Furthermore, the insulating layer 12 is disposed on the insulating layer 11 and has an opening portion OP that overlaps with the second electrode E2.

In the present embodiment, the third electrode E3 is disposed in a manner covering the second electrode E2 and the insulating layer 12.

Figure 7:
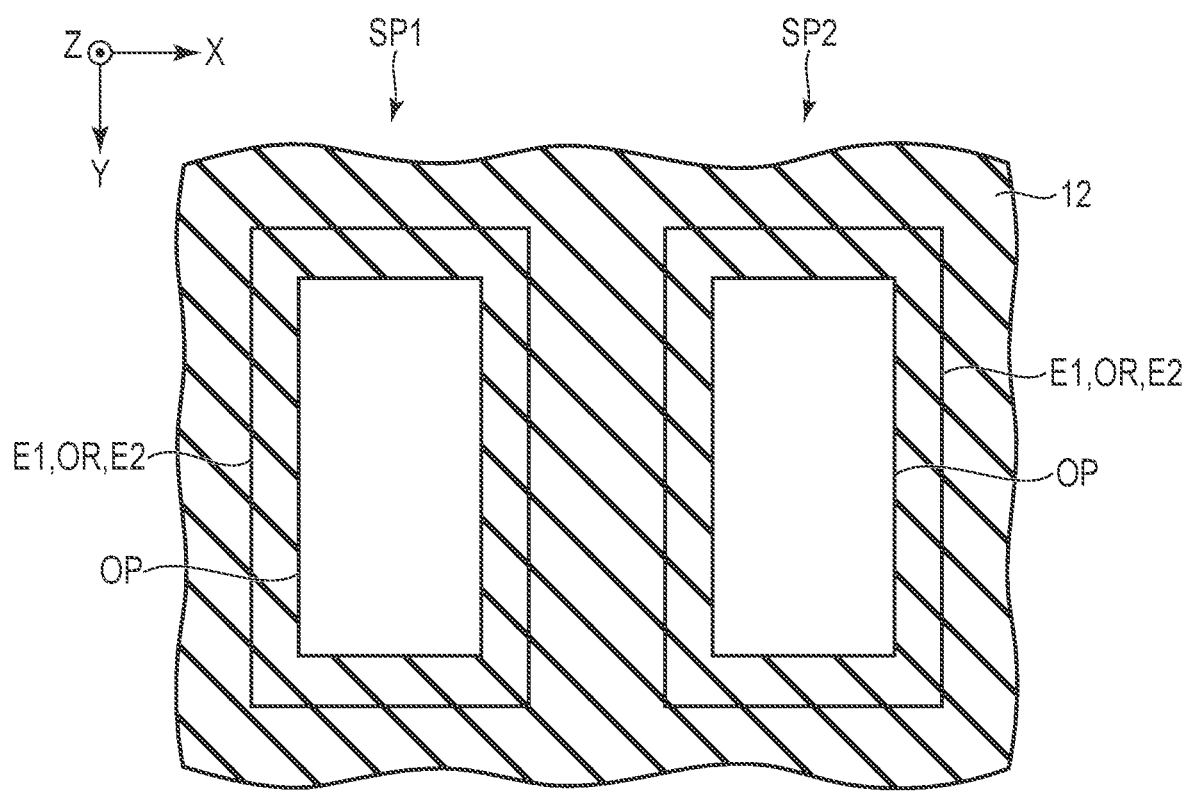
FIG. 7 is a schematic plan view of a sub-pixel in the present embodiment.

FIG. 7 is a schematic plan view of the sub-pixels SP1 and SP2 shown in FIG. 6. In the present embodiment, as shown in FIG. 7, the insulating layer 12 has an opening portion OP for each of the sub-pixels SP1 and SP2, and the first electrode E1, the organic layer OR, and the second electrode E2 are disposed at positions overlapping with the opening portion OP. The portion at which the first electrode E1, the organic layer OR, and the second electrode E2 overlap functions as a light-emitting part of each sub-pixel SP (SP1 and SP2), and light of the color corresponding to the sub-pixel SP can be emitted from the light-emitting part. According to such a configuration, for example, by forming the insulating layer 12 with a transparent organic material, light can be emitted (extracted) from an area one size larger than the opening portion OP, and a high aperture ratio can be achieved. In FIG. 7, the third electrode E3 is omitted.

Figure 8:
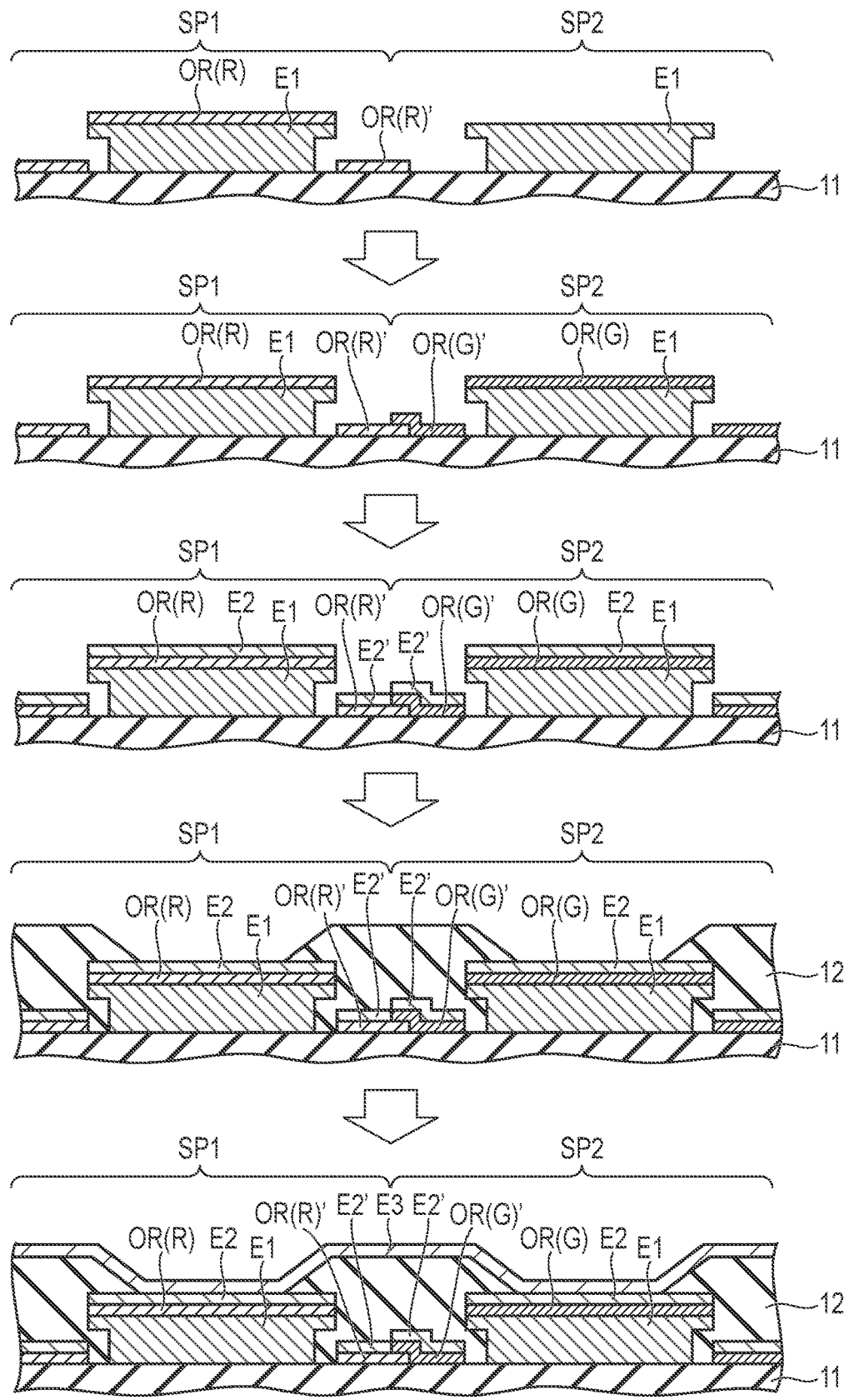
FIG. 8 is a diagram for explaining a process by which an organic layer, a second electrode, and a third electrode are formed in the display device according to the present embodiment.

Here, with reference to FIG. 8, a process by which the organic layer OR, the second electrode E2, and the third electrode E3 are formed in the display device DSP of the present embodiment will be briefly explained. Here, it is assumed that the first electrode E1 is already formed on the insulating layer 11.

First, the organic layer OR (R) is formed (deposited) on the first electrode E1, which is disposed at a position that overlaps with the sub-pixel SP1. In the present embodiment, as described above, the first electrode E1 is formed to be sufficiently thicker than the organic layer OR(R). Therefore, in the case of attempting to form the organic layer OR(R) at the position that overlaps with the sub-pixel SP1, the organic layer OR(R) is cut off at the edge portion of the first electrode E1 that is disposed at the position that overlaps with the sub-pixel SP1, and the organic layer OR(R) is formed in an island shape on the first electrode E1. In this case, an organic layer OR(R)' that is cut off at the edge portion of the first electrode E1 is disposed on the insulating layer 11.

In the case where the organic layer OR(R) is formed in the manner described above, the organic layer OR(G) is formed (deposited) on the first electrode E1 that is disposed at a position that overlaps with the sub-pixel SP2. As described above, the first electrode E1 is formed sufficiently thicker than the organic layer OR(G). Therefore, in the case of attempting to form the organic layer OR(G) at the position that overlaps with the sub-pixel SP1, the organic layer OR(G) is cut off at the edge portion of the first electrode E1 that is disposed at the position that overlaps with the sub-pixel SP2, and the organic layer OR(G) is formed in an island shape on the first electrode E1. In this case, an organic layer OR(G)' that is cut off at the edge portion of the first electrode E1 is disposed on the insulating layer 11.

In the case where the organic layer OR(G) is formed in the manner described above, the second electrode E2 is formed (deposited) on the organic layers OR(R) and OR(G). Since the present embodiment has a configuration in which the above mentioned first electrode E1 causes the organic layers OR(R)' and OR(G)' to be cut off, for example, by forming the second electrode E2 over the entire display area DA, the second electrode E2, separated for each sub-pixel SP, can be disposed on the first electrode E1 and the organic layer OR. A second electrode E2', which is cut off at the edge portion of the first electrode E1, is disposed on the organic layers OR(R)' and OR(G)' disposed on the insulating layer 11.

That is, in the present embodiment, by forming the first electrode E1 for each sub-pixel SP in a manner such that the organic layer OR and the second electrode E2 are cut off, the organic layer OR and the second electrode E2 can be formed separately for each sub-pixel SP.

In the present embodiment, in order to facilitate cutting off the organic layer OR and the second electrode E2, it is preferable to form the first electrode E1 in a manner such that the width of the upper part is greater than that of the lower part.

Specifically, in FIG. 6 and FIG. 8, the first electrode E1 is formed in a manner such that the width gradually decreases from the upper part to the lower part. For example, the first electrode E1 may be formed as a stacked layer body of a transparent electrode and a metal electrode (e.g., Ag, etc.). In the case of such a configuration, the first electrode E1 can be formed as shown in FIG. 6 and FIG. 8 by forming the first electrode E1 in a shape where the width of the upper part matches the width of the lower part, then removing the part configured by the metal electrode by side etching, etc. Note that the first electrode E1 may be formed by other processes as well.

The first electrode E1 may have a shape such as, for example, an inverted taper shape. Furthermore, the side surface of the first electrode E1 may be a plane inclined with respect to a third direction Z, or may be a curved surface.

In the case where the organic layers OR(R) and OR(G) and the second electrode E2 are formed in the manners described above, the insulating layer 12 that is disposed on the insulating layer 11 to cover the edge portions of the organic layers OR(R) and OR(G) and the second electrode E2, and has an opening portion OP that overlaps with the second electrode E2 is formed.

The second electrode E2 is an electrode for applying a common voltage to a plurality of sub-pixels SP (a plurality of pixels PX), and according to the process shown in FIG. 8 above, the second electrode E2 is formed in an island shape for each sub-pixel SP. In order to apply a common voltage to each of the plurality of second electrodes E2 formed in such an island shape, it is necessary to, for example, connect the second electrodes E2 formed at a position (area) that overlaps with each of the adjacent sub-pixels SP (e.g., sub-pixels SP1 and SP2). In the present embodiment, the third electrode E3 for connecting the two electrodes is formed (deposited) in a manner covering the second electrode E2 and the insulating layer 12. Such a third electrode E3 is to be formed over a plurality of pixels PX (sub-pixels SP) arranged in the display area DA. According to this third electrode E3, a common voltage can be applied to each of the sub-pixels SP through the second electrode E2, which is formed in an island shape at a position that overlaps with each of the plurality of sub-pixels SP.

In FIG. 6 to FIG. 8, the sub-pixels SP1 and SP2 are mainly described; however, the sub-pixel SP3 is also to be configured in the same manner as the sub-pixels SP1 and SP2.

As described above, the display device DSP according to the present embodiment includes a base material 10, an insulating layer 11 (first insulating layer) disposed on the base material 10, a first electrode E1 disposed on the insulating layer 11, an organic layer OR disposed on the first electrode E1, a second electrode E2 disposed on the organic layer, an insulating layer 12 disposed on the insulating layer 11 and having an opening portion OP that overlaps with the second electrode E2, and a third electrode E3 covering the second electrode E2 and the insulating layer 12. The first electrode E1, the organic layer OR, and the second electrode E2 are separated for each sub-pixel SP.

In the comparative example of the present embodiment described above, for example, lateral leakage may occur when the edge portion of the organic layer OR (R) of the sub-pixel SP1 overlaps with the edge portion of the organic layer OR (G) of the sub-pixel SP2 adjacent to the sub-pixel SP1. However, in the present embodiment, the organic layer OR (R) of the sub-pixel SP1 and the organic layer OR (G) of the sub-pixel SP2 are separated for each sub-pixel SP, thus preventing the occurrence of parasitic emission based on the lateral leakage and suppressing the deterioration of display quality.

In the present embodiment, the second electrodes E2 formed at a position that overlaps with the sub-pixel SP are connected through the third electrode E3. That is, in the present embodiment, even if the second electrode E2 is configured to be separated for each sub-pixel SP, the display device DSP (the second electrode E2 provided in the display device DSP) can be driven normally by the third electrode E3.

Furthermore, in the present embodiment, for example, by forming the first electrode E1 so that it has a thickness larger than the thickness of the organic layer OR, the organic layer OR (and the second electrode E2) can be cut off, and the organic layer OR can be separated appropriately for each sub-pixel SP. From the viewpoint of cutting off the organic layer OR appropriately, it is preferable that the first electrode E1 described above is formed in such a way that, for example, the width of the upper part is larger than that of the lower part. Here, a configuration is explained in which the first electrode E1 separates the organic layer OR (and the second electrode E2) for each sub-pixel SP. However, in the present embodiment, at least the organic layer OR needs to be separated for each sub-pixel SP to prevent the occurrence of lateral leakage, and the separation of the organic layer OR may be realized by means other than the first electrode E1.

Figure 9:
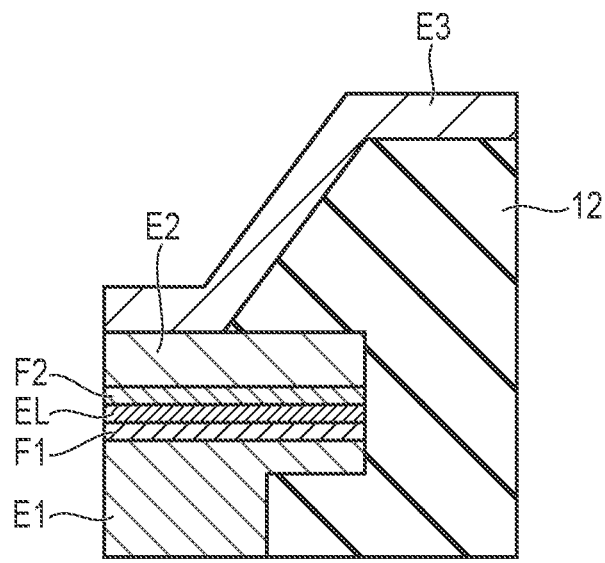
FIG. 9 is an enlarged view of edge portions of the organic layer and the second electrode in the display device according to the present embodiment.

Here, FIG. 9 shows an enlarged view of the edge portions (periphery) of the organic layer OR and the second electrode E2 in the display device DSP according to the present embodiment. Note that, although detailed explanations have been omitted in the present embodiment, the organic layer OR includes, for example, a functional layer F1, a light-emitting layer EL, and a functional layer F2, which are stacked in order from the first electrode E1 to the second electrode E2. In the case where the potential of the first electrode E1 is relatively higher than that of the second electrode E2, the first electrode E1 corresponds to the anode and the second electrode E2 corresponds to the cathode. In this case, the functional layer F1 between the light-emitting layer EL and the first electrode E1 includes at least one of a hole injection layer and a hole transport layer, and the functional layer F2 between the light-emitting layer EL and the second electrode E2 includes at least one of an electron transport layer and an electron injection layer. Each of the functional layers F1 and F2 is not limited to a single-layer body, but may also be a stacked layer body in which a plurality of functional layers are stacked.

Here, although the case in which the first electrode E1 corresponds to the anode and the second electrode E2 corresponds to the cathode has been described, it is also possible to configure the first electrode E1 to correspond to the cathode and the second electrode E2 to correspond to the anode.

In addition, here, although the organic layer OR is described as including the functional layer F1, the light-emitting layer EL, and the functional layer F2, the organic layer OR may further include other functional layers, or may have a configuration in which at least one of the functional layers F1 and F2 is omitted.

In FIG. 9, an example is shown in which the end surfaces of each of the organic layers OR (the functional layer F1, the light-emitting layer EL, and the functional layer F2) and the second electrode E2 are substantially aligned.

Figure 10:
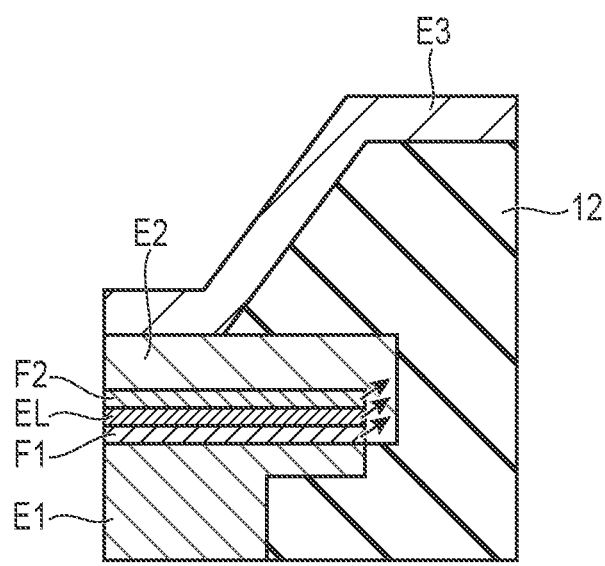
FIG. 10 is an enlarged view of edge portions of the organic layer and the second electrode in the display device according to the comparative example of the present embodiment.

On the other hand, FIG. 10 shows, as a comparative example of the present embodiment, an example in which the end surfaces (edge portions) of the functional layer F1, the light-emitting layer EL, and the functional layer F2 included in the organic layer OR are covered by the second electrode E2 disposed on the organic layer OR (in contact with the second electrode E2). Assuming that the organic layer OR and the second electrode E2 are configured in the manner shown in FIG. 10, a current that does not contribute to the emission of the light-emitting layer EL (edge leakage) is generated from the edge portion of the organic layer OR (the functional layer F1, the light-emitting layer EL, and functional layer F2). This edge leakage may cause the performance of the display device DSP to deteriorate.

For this reason, in the present embodiment, as shown in FIG. 9 above, it is preferable that the second electrode E2 is formed in a manner such that the second electrode E2 does not cover the end surfaces of the functional layer F1, the light-emitting layer EL, and the functional layer F2 provided in the organic layer OR (the end surfaces of the functional layer F1, the light-emitting layer EL, and the functional layer F2 do not come in contact with the second electrode E2). In other words, it is preferable that the organic layer OR and the second electrode E2 in the present embodiment are formed so that the edge portion (end surface) of the second electrode E2 matches the end surface of the organic layer OR in a plan view or is on the opening portion OP side (i.e., the center side of the sub-pixel SP) than the end surface of the organic layer OR is.

The second electrode E2 can be formed, for example, by a directional vacuum deposition method. However, the second electrode that does not cover the end surfaces of the functional layer F1, the light-emitting layer EL, and the functional layer F2 provided in the organic layer OR described above can be formed by considering the directivity in the vacuum deposition method.

In FIG. 9, an example in which the end surfaces of the functional layer F1, the light-emitting layer EL, and the functional layer F2 provided in the organic layer OR are substantially aligned. However, as long as the second electrode E2 is formed so that it does not cover the end surfaces of the functional layer F1, the light-emitting layer EL, and the functional layer F2 as described above, the end surfaces of each of the functional layer F1, the light-emitting layer EL, and the functional layer F2 do not have to be aligned.

In the present embodiment, the pixel PX includes sub-pixels SP1, SP2 and SP3, and each of the sub-pixels SP1, SP2 and SP3 includes a display element 20 that emits light corresponding to red, green and blue wavelengths. However, the display element 20 of each of the sub-pixels SP1, SP2 and SP3 may also emit, for example, white light. In this case, for example, by providing a color filter colored red, green, and blue at a position facing each of the display elements 20 (a position in the direction of a counter-substrate) in the display device DSP, red, green, and blue light can be emitted from each pixel PX, thus enabling multi-color display.

Each of the sub-pixels SP1, SP2, and SP3 described above may be provided with a display element 20 that emits ultraviolet light (i.e., the emitting color is ultraviolet light). In such a configuration, multi-color display can be realized by disposing a light conversion layer at a position facing the display element 20.

Furthermore, in the present embodiment, although the pixel PX has been explained as including a plurality of sub-pixels SP, the pixel PX may be configured not to include the sub-pixels SP (i.e., a single color is displayed by the pixel PX).

In the case of forming an organic layer OR (i.e., for example, an organic layer OR including a light-emitting layer emitting white color) common to a plurality of pixels PX (or sub-pixels SP) disposed in the display area DA, in the present embodiment, by a configuration including a first electrode E1 capable of cutting off the organic layer OR, and by depositing the organic layer OR (organic material for forming the organic layer OR) on the entire DA, it is possible to form an organic layer OR separated for each pixel PX (sub-pixel SP). That is, the present embodiment can be applied to WOLEDs, etc., in which the organic layer OR is not separated, and in such a configuration, there is no need to use a fine mask, etc., when forming the organic layer OR (i.e., separating the organic layer OR for each pixel PX or sub-pixel SP).

Second Embodiment

Now, a second embodiment will be described. In the following description, detailed descriptions of the same parts as those in the first embodiment described above will be omitted. Here, parts that differ from the first embodiment are mainly described.

FIG. 11 shows an example of a cross-section of a display area provided in a display device of the present embodiment. Here, a sub-pixel SP1 and a sub-pixel SP2 adjacent to the sub-pixel SP1, which are provided in a pixel PX disposed in a display area DA, are mainly described. In FIG. 11, parts that are the same as those in FIG. 6 are given the same reference symbols as those in FIG. 6 above, and detailed descriptions thereof are omitted. Parts that differ from FIG. 6 are described.

In the first embodiment described above, as shown in FIG. 6, the second electrode E2 is disposed on the organic layer OR, and the third electrode E3 is formed to cover the second electrode E2 and the insulating layer 12. The present embodiment differs from the first embodiment in that the second electrode E2 is omitted, and the third electrode E3 is formed to cover the organic layer OR and the insulating layer 12.

Since a display device DSP shown in FIG. 11 is similar to the display device DSP shown in FIG. 6 above except that the second electrode E2 is omitted as described above, here, a detailed description thereof is omitted.

Figure 12:
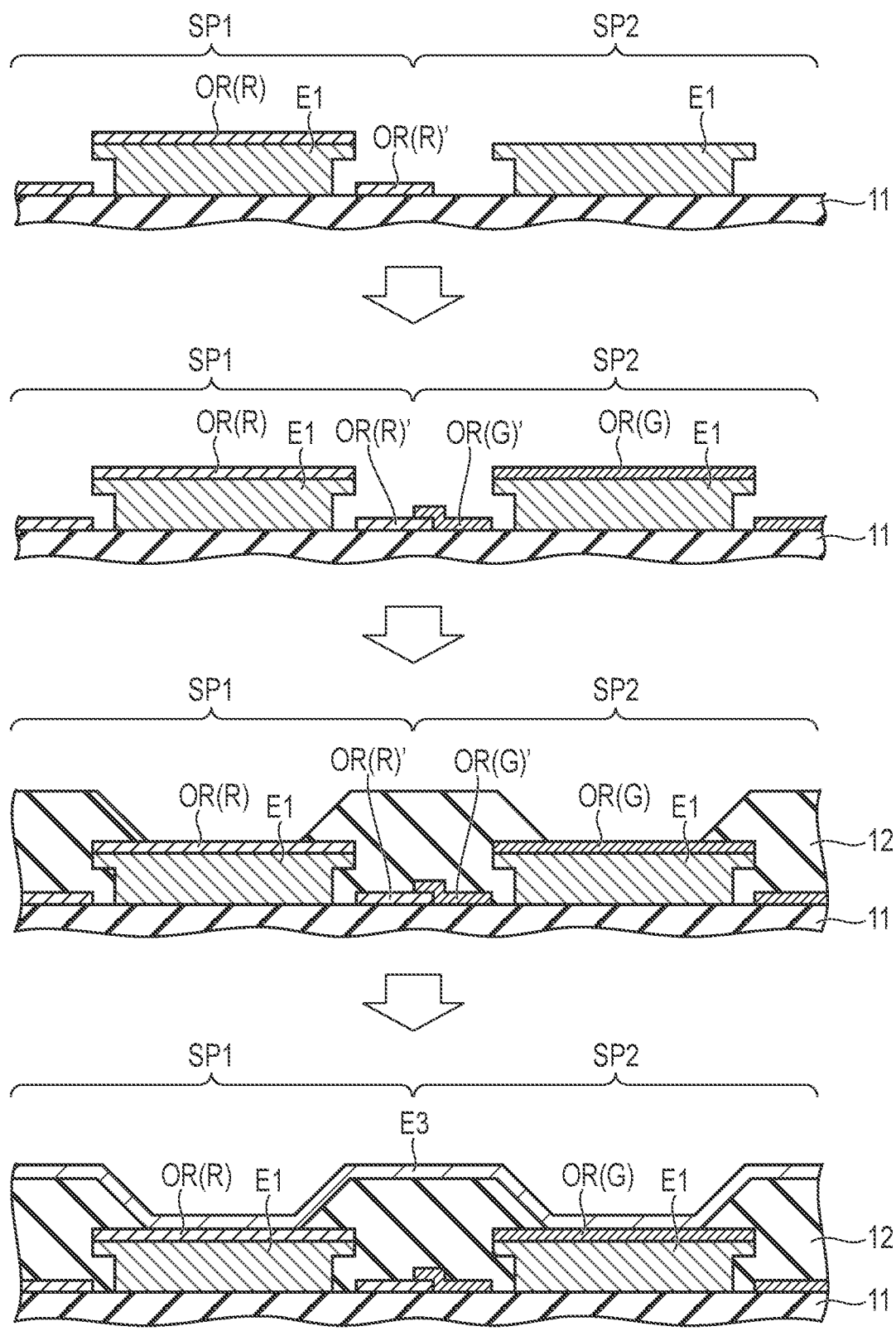
FIG. 12 is a drawing for explaining a process by which an organic layer and a third electrode are formed in the display device according to the present embodiment.

Here, with reference to FIG. 12, a process by which the organic layer OR and the third electrode E3 are formed in the display device DSP of the present embodiment will be briefly explained. Here, it is assumed that a first electrode E1 is already formed on an insulating layer 11.

First, an organic layer OR (R) is formed (deposited) on the first electrode E1, which is disposed at a position overlapping with the sub-pixel SP1. In this case, by the first electrode E1, the organic layer OR(R) is disposed on the first electrode E1, and an organic layer OR(R)', which is cut off at the edge portion of the first electrode E1, is disposed on the insulating layer 11.

In the case where the organic layer OR(R) is formed in the manner described above, an organic layer OR(G) is formed (deposited) on the first electrode E1 disposed at a position overlapping with the sub-pixel SP2. In this case, by the first electrode E1, the organic layer OR(G) is disposed on the first electrode E1, and an organic layer OR(G)', which is cut off at the edge portion of the first electrode E1, is disposed on the insulating layer 11.

In the case where the organic layers OR(R) and OR(G) are formed in the manners described above, the insulating layer 12 that is disposed on the insulating layer 11 to cover the edge portions of the organic layers OR(R) and OR(G), and has an opening portion OP that overlaps with the organic layer OR is formed.

When the insulating layer 12 is formed in the manner described above, for example, the third electrode E3 is formed (deposited) over a plurality of pixels PX (sub-pixels SP) disposed in the display area DA. According to such a third electrode, a common voltage can be applied to each of the plurality of pixels PX.

In FIG. 11 and FIG. 12, the sub-pixels SP1 and SP2 are mainly described; however, a sub-pixel SP3 is also to be configured in the same manner as the sub-pixels SP1 and SP2.

As described above, the display device DSP according to the present embodiment includes a base material 10, an insulating layer 11 (first insulating layer) disposed on the base material 10, a first electrode E1 disposed on the insulating layer 11, an organic layer OR disposed on the first electrode E1, an insulating layer 12 (second insulating layer) disposed on the insulating layer 11 and having an opening portion OP that overlaps with the organic layer OR, and a third electrode E3 (second electrode) covering the organic layer OR and the insulating layer 12. The first electrode E1 and the organic layer OR are separated for each sub-pixel SP.

In the present embodiment, the above-described configuration prevents the occurrence of parasitic emission based on lateral leakage and suppresses the deterioration of display quality, as in the first embodiment.

Here, FIG. 13 shows an enlarged view of the edge portion (periphery) of the organic layer OR in the display device DSP of the present embodiment.

In the present embodiment, as shown in FIG. 13, the end surfaces (edge portions) of a functional layer F1, a light-emitting layer EL, and a functional layer F2 included in the organic layer OR are covered by the insulating layer 12, so that no edge leakage occurs from the organic layer OR.

That is, in the first embodiment described above, there is a possibility that edge leakage may occur from the organic layer OR when the organic layer OR and the second electrode E2 are formed in the manner shown in, for example, FIG. 10. However, in the present embodiment, the occurrence of edge leakage from the organic layer OR can be prevented more reliably, which is an advantage compared to the first embodiment.

In the first embodiment described above, for example, a configuration in which a second electrode E2 is provided to protect the display element 20 (e.g., organic layer OR) in the process of forming the third electrode E3 is adopted. However, in the case where there is no need to protect the display element 20 in the process of forming the third electrode E3 (i.e., there is no damage to the element), the configuration of the present embodiment can be adopted, and the manufacturing process of the display device DSP can be simplified compared to the first embodiment described above.

Also, although detailed description is omitted, the display device DSP of the present embodiment may be configured to include a color filter or a light conversion layer, as in the first embodiment described above, or the pixel PX may be configured not to include a sub-pixel SP.

All display devices, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A display device comprising:
   a base material;
   a first insulating layer disposed on the base material;
   a first electrode disposed on the first insulating layer;
   an organic layer disposed on the first electrode;
   a second electrode disposed on the organic layer;
   a second insulating layer disposed on the first insulating layer and including an opening portion overlapping with the second electrode; and
   a third electrode covering the second electrode and the second insulating layer, wherein
   the first electrode, the organic layer, and the second electrode comprise a light emitting element and are separated for each pixel,
   the second electrode and the third electrode are electrically connected, and
   the organic layer and the second electrode are further disposed apart from the first electrode on the first insulating layer and covered with the second insulating layer,
   wherein the organic layer includes a light-emitting layer and a functional layer, and
   the second electrode is formed in a manner not to cover end surfaces of the light-emitting layer and the functional layer.

2. The display device of claim 1, wherein a thickness of the first electrode is greater than a thickness of the organic layer.

3. The display device of claim 2, wherein the first electrode has a shape in which a width of an upper part is greater than a width of a lower part.

* * * * *